United States Patent
Achtner et al.

[11] Patent Number: 5,652,022
[45] Date of Patent: Jul. 29, 1997

[54] METHOD AND APPARATUS FOR THE PRODUCTION OF METAL-FREE AREAS DURING METAL VAPOR DEPOSITION

[75] Inventors: Wolfgang Achtner, Maintal; Thomas Vogt, Grosskrotzenburg; Günter Klemm, Nidda; Detlef Eller, Hammersbach, all of Germany

[73] Assignee: Balzers Und Leybold Deutschland Holding AG, Hanau, Germany

[21] Appl. No.: 681,016

[22] Filed: Jul. 22, 1996

[30] Foreign Application Priority Data

Jul. 28, 1995 [DE] Germany ............ 195 27 604.3

[51] Int. Cl.⁶ .................................................. C23C 16/00
[52] U.S. Cl. ............................ 427/251; 118/50; 118/65; 118/67; 118/68; 118/70; 118/600; 118/718; 118/721; 118/724; 118/729; 427/248.1; 427/272; 427/282; 427/294; 427/322; 427/372.2; 427/404; 427/417; 427/421
[58] Field of Search ..................... 427/251, 248.1, 427/272, 282, 294, 322, 372.2, 404, 417, 421; 118/718, 721, 724, 729, 50, 65, 67, 68, 70, 600

[56] References Cited

U.S. PATENT DOCUMENTS

| 2,898,241 | 8/1959 | Charlton et al. ............ 117/212 |
| 4,478,878 | 10/1984 | Neuwald ................... 427/79 |
| 4,962,725 | 10/1990 | Heinz et al. ............... 118/718 |
| 5,211,757 | 5/1993 | Mounoussamy et al. ....... 118/504 |

*Primary Examiner*—Bernard Pianalto
*Attorney, Agent, or Firm*—Felfe & Lynch

[57] ABSTRACT

An area of an insulating strip (3) which is to remain free of metal is covered by an endless cover strip (4), which rests on the insulating strip (3) and travels along with it at the same speed. Before it enters a vapor deposition zone (5), the cover strip is provided with a film of oil on the side facing the metal evaporator (6) and, after the cover strip (4) has passed through the vapor deposition zone (5) and after the cover strip (4) and the insulating strip (3) have been separated from each other, the oil which has been deposited from the vapor phase onto the cover strip (4) is removed by heating the cover strip (4) with a heater (7) installed in the immediate vicinity of the cover strip (4).

4 Claims, 1 Drawing Sheet

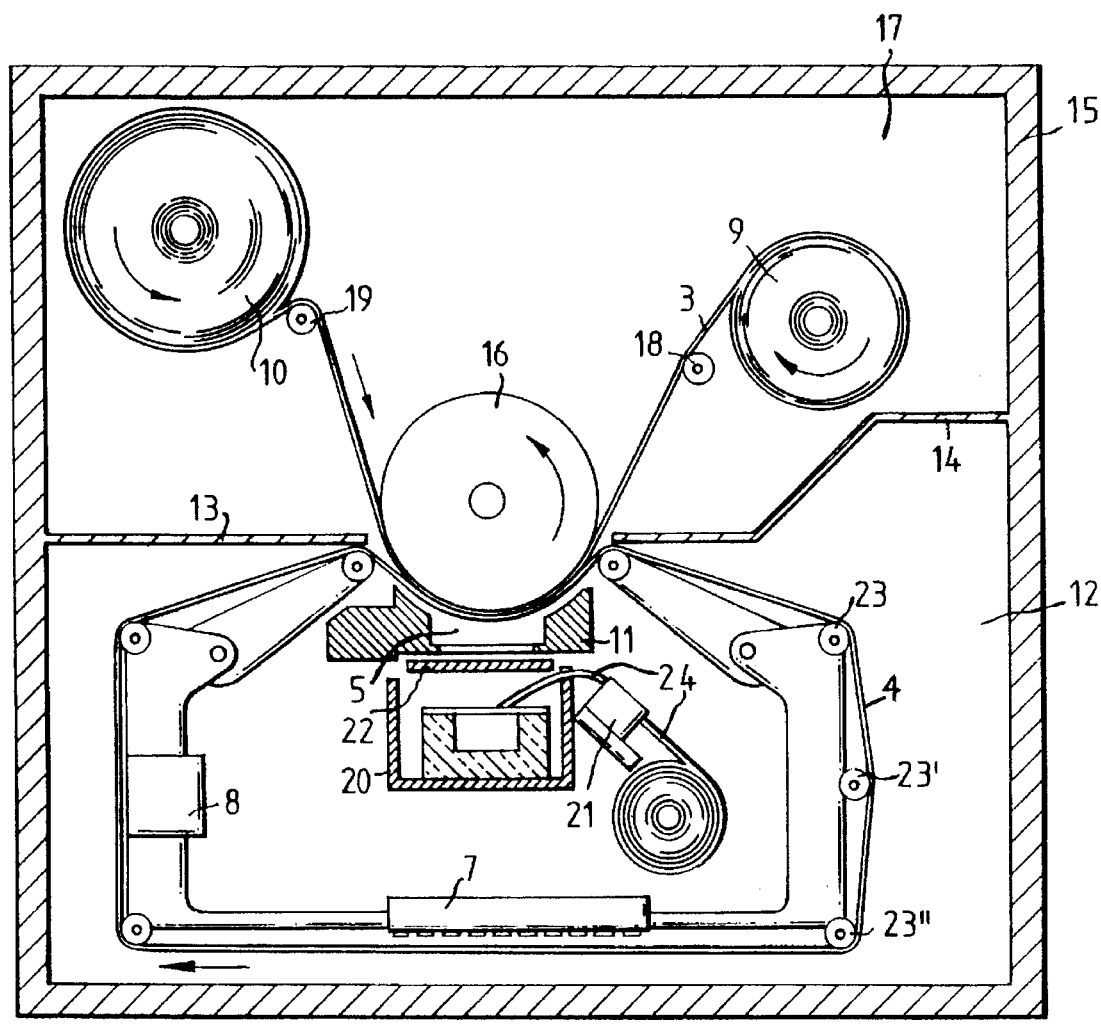

5,652,022

METHOD AND APPARATUS FOR THE PRODUCTION OF METAL-FREE AREAS DURING METAL VAPOR DEPOSITION

BACKGROUND OF THE INVENTION

The invention pertains to a method and apparatus for the production of metal-free areas during the deposition of metal from the vapor phase onto a strip of insulating material intended for use in electrical capacitors. The area of the insulating strip which is to remain free of metal is covered by an endless cover strip, which rests on the insulating strip and is conducted along with it at the same speed. The cover strip is coated with oil on the side facing the metal evaporator before it enters the vapor deposition zone.

Apparatus of the type in question is known, in which a cover strip of paper or metal is conducted synchronously and in contact with the insulating strip so that metal-free areas can be produced on the strip of insulating material to be coated (U.S. Pat. No. 2,898,241).

A process for the production of metal-free areas on a strip of insulating material during the process of metal vapor deposition by means of which gradual transitions between the metal coatings and the metal-free areas are produced is also known (U.S. Pat. No. 4,478,878).

SUMMARY OF THE INVENTION

Objects of the invention are first, to produce a sharp transition from the metal strip to the metal-free area is produced. Second, it is to be guaranteed that no contamination of the winding device or of the insulating strip by excess oil dripping off or scraped from the cover strip can occur.

According to the invention, after the cover strip has passed through the vapor deposition zone and after the cover strip and the insulating strip have been separated from each other, the oil which had been deposited on the cover strip from the vapor phase is removed by heating the cover strip on a heater installed in the immediate vicinity of the cover strip. As a result, the oil deposited onto the strip from the vapor phase before the strip enters the metal vapor deposition zone is removed by evaporation after the strip has emerged from the metal vapor deposition zone and can thus be drawn off by a vacuum pump.

BRIEF DESCRIPTION OF THE DRAWING

The sole FIGURE is a schematic cross-section of the apparatus.

DETAILED DESCRIPTION OF THE PREFERRED EMBODIMENT

The apparatus for producing metal-free areas during the deposition of metal from the vapor phase onto a strip of insulating material 3 consists essentially of a vacuum chamber 15, which is divided by partition plates 13, 14 into an evaporator chamber 12 and a winding space 17. A rotatably supported coating roll 16 is installed in such a way that it projects into the evaporator chamber through the gap between the partition plates. Insulating strip 3 is guided over coating roll 16; the strip is fed from a supply roll 10, over coating roll 16, and onto takeup roll 9 with the help of auxiliary rolls 18, 19. Underneath coating roll 16 is a metal evaporator 6, which is enclosed by an evaporator box 20 and works together with a wire feed device 21. The evaporator box is provided at the top with a diaphragm 22, which can be moved out of the area of the evaporator boat and which forms the bottom boundary of an evaporation zone 5, which is enclosed by a collar 11. Cover strip 4 is guided over guide rolls 23, 23', . . . and coating roll 16 and is designed as an endless strip.

During the coating operation, insulating strip 3 passes from supply roll 10 over coating roll 16 and auxiliary roll 18 onto takeup roll 9. Endless cover strip 4 passes over coating roll 16 simultaneously and synchronously with insulating strip 3; in the area of evaporation zone 5, cover strip 4 rests firmly, with pretension, on insulating strip 3. A metal wire 24 to be evaporated is fed from wire feed device 21 to metal evaporator 6, where it is evaporated; if diaphragm 22 has been opened (or removed), the rising metal vapor ascends into evaporation zone 5, surrounded by collar 11, and is deposited onto the areas of the insulating strip which are left exposed by cover strip 4. The side of cover strip 4 facing away from insulating strip 3 has previously been coated with oil from the vapor phase by oil evaporator 8, so that thereafter no metal vapor can precipitate onto cover strip 4. After cover strip 4 has passed through evaporation zone 5 and the tow strips 3, 4 are not in contact with each other, it passes over a heater 7, which evaporates all of the oil deposited on the cover strip. The strip 4 can then be provided with a fresh film of oil by the oil evaporator before the two strips are again in contact with each other. In this way, it is guaranteed that cover strip 4 produces sharp transitions from the coated to the uncoated areas of insulating strip 3. The removal of the oil film from the cover strip immediately after the strip has passed through evaporation zone 5 ensures that the oil film on the cover strip never becomes too thick and irregular or that so much oil accumulates on strip 4 that it drips off the strip or creeps onto the areas of the film strip to be coated while the two strips 3, 4 are in contact with each other.

What is claimed is:

1. Method for producing metal free areas on a strip of insulating material while depositing metal from the vapor phase onto said strip, said method comprising passing a strip of insulating material through a vapor deposition zone having a metal evaporator, passing an endless cover strip through said vapor deposition zone at the same speed as said strip of insulating material, said cover strip being in contact with and partially covering said insulating strip in said vapor deposition zone and having a side facing said metal evaporator, thereby leaving metal free areas on said insulating strip, depositing a film of oil on said side of cover strip while said cover strip is not in contact with said insulating strip and before said cover strip passes through said vapor deposition zone, and removing said film of oil from said cover strip while said cover strip is not in contact with said insulating strip and after said cover strip passes through said vapor deposition zone.

2. Method as in claim 1 wherein the film of oil is deposited on the side of the cover strip from the vapor phase by means of an evaporator prior to passing the cover strip through the vapor deposition zone.

3. Method as in claim 1 wherein the film of oil is removed from the cover strip by heating the cover strip by means of a heater in the immediate vicinity of the cover strip after passing the cover strip through the vapor deposition zone.

4. Apparatus for producing metal free areas on a strip of insulating material while depositing metal from the vapor phase onto said strip, said apparatus comprising

- a vacuum chamber having a winding space and an evaporator chamber separated by partition means, said winding space having therein a coating roll having a portion which is exposed to said evaporator chamber through said partition means, and supply and take up rolls which feed an insulating strip around the exposed portion of said coating roll in a direction of travel,

- a metal evaporator facing said exposed portion of said coating roll in said evaporator chamber to form a vapor deposition zone between said evaporator and said exposed portion, said zone being shielded from the evaporator chamber by a collar,

- means for passing an endless cover strip through said vapor deposition zone in the same direction of travel and at the same speed as said insulating strip, said cover strip being in contact with and partially covering said insulating strip on said exposed portion of said coating roll, said cover strip having a side facing said metal evaporator,

- an oil evaporator in said evaporator chamber upstream in the direction of travel from said vapor deposition zone where said cover strip is not in contact with said insulating strip, said oil evaporation depositing a film of oil on said side of said cover strip before passing into said vapor deposition zone, and

- a heating device in said evaporator chamber downstream in the direction of travel from said vapor deposition zone where said cover strip is not in contact with said insulating strip, said heating device heating said cover strip to remove said oil after passing the cover strip through the vapor deposition zone.

* * * * *